(12) United States Patent
Liu et al.

(10) Patent No.: US 11,823,756 B2
(45) Date of Patent: Nov. 21, 2023

(54) METHOD AND DEVICE FOR TESTING MEMORY ARRAY STRUCTURE, AND STORAGE MEDIUM

(71) Applicant: CHANGXIN MEMORY TECHNOLOGIES, INC., Hefei (CN)

(72) Inventors: Jianbin Liu, Hefei (CN); Maosong Ma, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/884,928

(22) Filed: Aug. 10, 2022

(65) Prior Publication Data

US 2023/0139518 A1 May 4, 2023

Related U.S. Application Data

(63) Continuation of application No. PCT/CN2021/136448, filed on Dec. 8, 2021.

(30) Foreign Application Priority Data

Nov. 1, 2021 (CN) .......................... 202111282629.6

(51) Int. Cl.
*G11C 29/10* (2006.01)
*G11B 20/18* (2006.01)
(Continued)

(52) U.S. Cl.
CPC .......... *G11C 29/10* (2013.01); *G01R 31/3171* (2013.01); *G11B 20/1816* (2013.01); *G11C 29/36* (2013.01)

(58) Field of Classification Search
CPC . G11C 29/10; G11C 29/36; G11C 2029/1202; G01R 31/3171; G11B 20/1816
See application file for complete search history.

(56) References Cited

U.S. PATENT DOCUMENTS

| 5,113,399 A | 5/1992 | Woods | |
| 5,933,381 A * | 8/1999 | Iwata | G11C 29/02 365/222 |

(Continued)

FOREIGN PATENT DOCUMENTS

CN 101243450 A 8/2008

OTHER PUBLICATIONS

R. S. Sable, R. P. Saraf, R. A. Parekhji and A. N. Chandorkar, "Built-in self-test technique for selective detection of neighbourhood pattern sensitive faults in memories," 17th International Conference on VLSI Design. Proceedings., Mumbai, India, 2004, pp. 753-756. (Year: 2004).*

(Continued)

*Primary Examiner* — Cynthia Britt
(74) *Attorney, Agent, or Firm* — Cooper Legal Group, LLC

(57) ABSTRACT

A method and device for testing a memory array structure, and a non-transitory storage medium are provided. The method includes that: respective storage data corresponding to each preset test pattern is written into a to-be-tested memory array, the each preset test pattern being one of preset test patterns in a preset test pattern library; a row aggressing test is repeatedly performed on the to-be-tested memory array until a bit error occurs in the storage data, to obtain row aggressing test times, corresponding to the each preset test pattern, of the to-be-tested memory array, where the bit error characterizes that the storage data has changed; a target preset test pattern corresponding to the to-be-tested memory array is determined from the preset test pattern library based on the row aggressing test times; and an array structure of the to-be-tested memory array is determined based on the target preset test pattern.

20 Claims, 13 Drawing Sheets

(51) Int. Cl.
*G01R 31/317* (2006.01)
*G11C 29/36* (2006.01)

(56) References Cited

U.S. PATENT DOCUMENTS

| | | | | |
|---|---|---|---|---|
| 5,991,213 A | * | 11/1999 | Cline | G11C 29/56012 |
| | | | | 365/201 |
| 7,725,770 B2 | * | 5/2010 | Owen | G06F 11/26 |
| | | | | 714/27 |
| 9,087,602 B2 | * | 7/2015 | Youn | G11C 11/40618 |
| 2008/0235796 A1 | | 9/2008 | Buhr | |
| 2012/0060058 A1 | | 3/2012 | Prakash | |
| 2013/0332785 A1 | | 12/2013 | Prakash | |
| 2015/0310933 A1 | * | 10/2015 | Purushotham | G11C 29/36 |
| | | | | 714/719 |
| 2020/0081631 A1 | | 3/2020 | Schaefer et al. | |
| 2020/0388326 A1 | * | 12/2020 | He | G11C 11/40618 |
| 2021/0200460 A1 | | 7/2021 | Lu et al. | |
| 2021/0224449 A1 | | 7/2021 | Forte et al. | |
| 2022/0069992 A1 | * | 3/2022 | Ayyapureddi | G06F 11/1068 |
| 2022/0179795 A1 | * | 6/2022 | Sharifi Tehrani | G06F 11/1048 |
| 2023/0139518 A1 | * | 5/2023 | Liu | G11C 29/10 |
| | | | | 714/704 |

OTHER PUBLICATIONS

S. Hillebrecht, I. Polian, P. Engelke, B. Becker, M. Keim and W.-T. Cheng, "Extraction, Simulation and Test Generation for Interconnect Open Defects Based on Enhanced Aggressor-Victim Model," 2008 IEEE International Test Conference, Santa Clara, CA, USA, 2008, pp. 1-10. (Year: 2008).*

Barbara Aichinger, "DDR Memory Errors caused by Row Hammer", IEEE Conference on High Performance Extreme Computing 2015. https://sci-hubtw.hkvisa.net/10.1109/HPEC.2015.7322462, 5 pages.

Brent Keeth, R.Jacob Baker, Brian Johnson, Feng Lin, "DRAM Circuit Design", ISBN 978-0-470-18475-2, IEEE (2007), 428 pages.

* cited by examiner

METHOD AND DEVICE FOR TESTING MEMORY ARRAY STRUCTURE, AND STORAGE MEDIUM

CROSS-REFERENCE TO RELATED APPLICATION

The application is a continuation of International Patent Application No. PCT/CN2021/136448, filed on Dec. 8, 2021, which claims priority to Chinese Patent Application No. 202111282629.6, filed on Nov. 1, 2021 and entitled "METHOD AND DEVICE FOR TESTING MEMORY ARRAY STRUCTURE, AND STORAGE MEDIUM". The disclosures of International Patent Application No. PCT/CN2021/136448 and Chinese Patent Application No. 202111282629.6, are hereby incorporated by reference in their entireties.

BACKGROUND

During IC design, reverse design is usually required. The reverse design analyzes and makes reference to an internal structure of an existing chip.

However, due to characteristics such as micro-size, large-scale integration of the chip, or the like, implementation of the reverse design requires usage of a dedicated reverse test device which is costly and complicated to operate. With critical dimensions of the chip decreasing continuously, the reverse test device becomes more and more difficult to meet the requirements of the reverse design.

SUMMARY

The disclosure relates to the technical field of integrated circuit (IC) designs, and in particular to a method and device for testing a memory array structure, and a non-transitory storage medium.

In a first aspect, a method for testing a memory array structure is provided. The method includes the following operations.

Respective storage data corresponding to each preset test pattern is written into a to-be-tested memory array, where the each preset test pattern is one of preset test patterns in a preset test pattern library.

A row aggressing test is repeatedly performed on the to-be-tested memory array until a bit error occurs in the storage data, to obtain row aggressing test times corresponding to the each preset test pattern of the to-be-tested memory array, where the bit error characterizes that the storage data has changed.

A target preset test pattern corresponding to the to-be-tested memory array is determined from the preset test pattern library based on the row aggressing test times.

An array structure of the to-be-tested memory array is determined based on the target preset test pattern.

In a second aspect, a device for testing a memory array structure is provided. The device includes a memory and a processor.

The memory is configured to store instructions executable by the processor.

The processor is configured to perform, when executing the executable instructions stored in the memory, operations including:

writing respective storage data corresponding to each preset test pattern into a to-be-tested memory array, where the each preset test pattern is one of preset test patterns in a preset test pattern library;

repeatedly performing a row aggressing test on the to-be-tested memory array until a bit error occurs in the storage data, to obtain row aggressing test times corresponding to the each preset test pattern of the to-be-tested memory array, where the bit error characterizes that the storage data has changed;

determining, based on the row aggressing test times, a target preset test pattern corresponding to the to-be-tested memory array from the preset test pattern library; and determining an array structure of the to-be-tested memory array based on the target preset test pattern.

In a third aspect, a non-transitory storage medium is provided. The non-transitory storage medium stores executable instructions that, when executed by a processor, cause the processor to perform operations including:

writing respective storage data corresponding to each preset test pattern into a to-be-tested memory array, where the each preset test pattern is one of preset test patterns in a preset test pattern library;

repeatedly performing a row aggressing test on the to-be-tested memory array until a bit error occurs in the storage data, to obtain row aggressing test times corresponding to the each preset test pattern of the to-be-tested memory array, where the bit error characterizes that the storage data has changed;

determining, based on the row aggressing test times, a target preset test pattern corresponding to the to-be-tested memory array from the preset test pattern library; and determining an array structure of the to-be-tested memory array based on the target preset test pattern.

DETAILED DESCRIPTION

Figure 1:
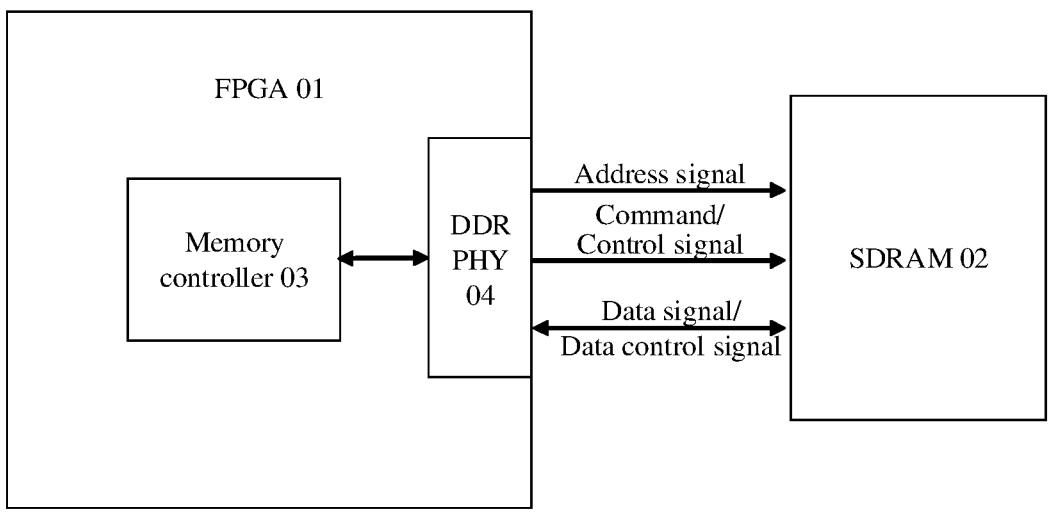
FIG. 1 is a schematic architectural diagram of a method for testing a memory array structure according to an embodiment of the disclosure.

In order to make the objectives, technical solutions and advantages of the disclosure clearer, the technical solutions of the disclosure are further described in detail below with reference to the accompanying drawings and embodiments. The described embodiments shall not be construed as limitation of the disclosure. All other embodiments obtained by those of ordinary skill in the art without paying any creative work shall fall within the scope of protection of the disclosure.

In the following descriptions, reference is made to "some embodiments" which describe a subset of all possible embodiments. However, it may be understood that "some embodiments" may be a same or different subset of all possible embodiments and may be combined with each other without conflict.

When "first/second" or a similar description appears in the application document, the following explanations are added. In the following descriptions, the term "first/second/third" involved is intended only to distinguish similar objects and does not represent a specific order for the objects. It may be understood that "first/second/third" may interchange a specific order or ranking where allowed, so that the embodiments of the disclosure described here may be implemented in an order other than those illustrated or described here.

Unless defined otherwise, all technical and scientific terms used herein have the same meaning as commonly understood by those of ordinary skill in the art to which the disclosure belongs. The terms used herein are intended only to describe the embodiments of the disclosure, and are not intended to limit the disclosure.

During IC design, it is usually necessary to analyze and make reference to an internal structure of an existing chip, that is, reverse design is required. In particular, manufacturers which start late in design and production have a big gap with respect to international advanced design and production manufacturers, and need to learn from and make reference to design methods and experience of other manufacturers.

However, design methods of various manufacturers are usually not disclosed to the public, and in order to understand internal structures of their chips, it is usually necessary to use a dedicated reverse test device which is costly and complicated to operate. For example, ADVANTEST T5503HS is a conventional Automatic Test Equipment (ATE) testing machine capable of achieving certain testing and analysis operations of SDRAM array, however, it is expensive and may cost up to 2 million dollars per each machine. Furthermore, the ATE testing machine has complicated operation processes, including Depot, Delayering, Imaging, Stitching, Aligning, Annotation, Extraction, Analysis, Schematic Capture, Netlist, Simulation, Verification, and Reports. Therefore, the ATE testing machine cannot be popularized easily.

On the other hand, with continuous development of IC technologies, integration of chip becoming higher and higher, testing and analysis operations of an internal structure of the chip become more and more difficult, and the existing test devices become more and more difficult to meet the requirements of the reverse design.

In view of the above problems, it is desirable that the embodiments of the disclosure provide a method and device for testing a memory array structure, and a storage medium, which can determine the memory array structure without using conventional reverse test devices, thereby reducing the cost of the reverse design and simplifying the reverse design process.

FIG. 1 is an optional schematic architectural diagram of a method for testing a memory array structure according to an embodiment of the disclosure. As shown in FIG. 1, the embodiment of the disclosure may test and analyze SDRAM 02 based on a Field Programmable Gate Array (FPGA) 01. The embodiment of the disclosure may develop a customized memory controller 03 and a Double Data Rate (DDR) Physical Layer (PHY) 04 based on FPGA 01 platform, to transmit any command that meets the requirement of Joint Electron Device Engineering Council (JEDEC) to any specified address within SDRAM 02. The memory controller 03 and the DDR PHY 04 are located in a Central Processing Unit (CPU) or a System on Chip (SoC) main control chip, the memory controller 03 is connected to the DDR PHY 04, and the DDR PHY 04 is externally connected to SDRAM 02. The memory controller 03 is responsible for transmitting commands such as read/write to the DDR PHY 04; and the DDR PHY 04 translates the commands into control signals and transmits them to respective pins on SDRAM 02.

Figure 2:
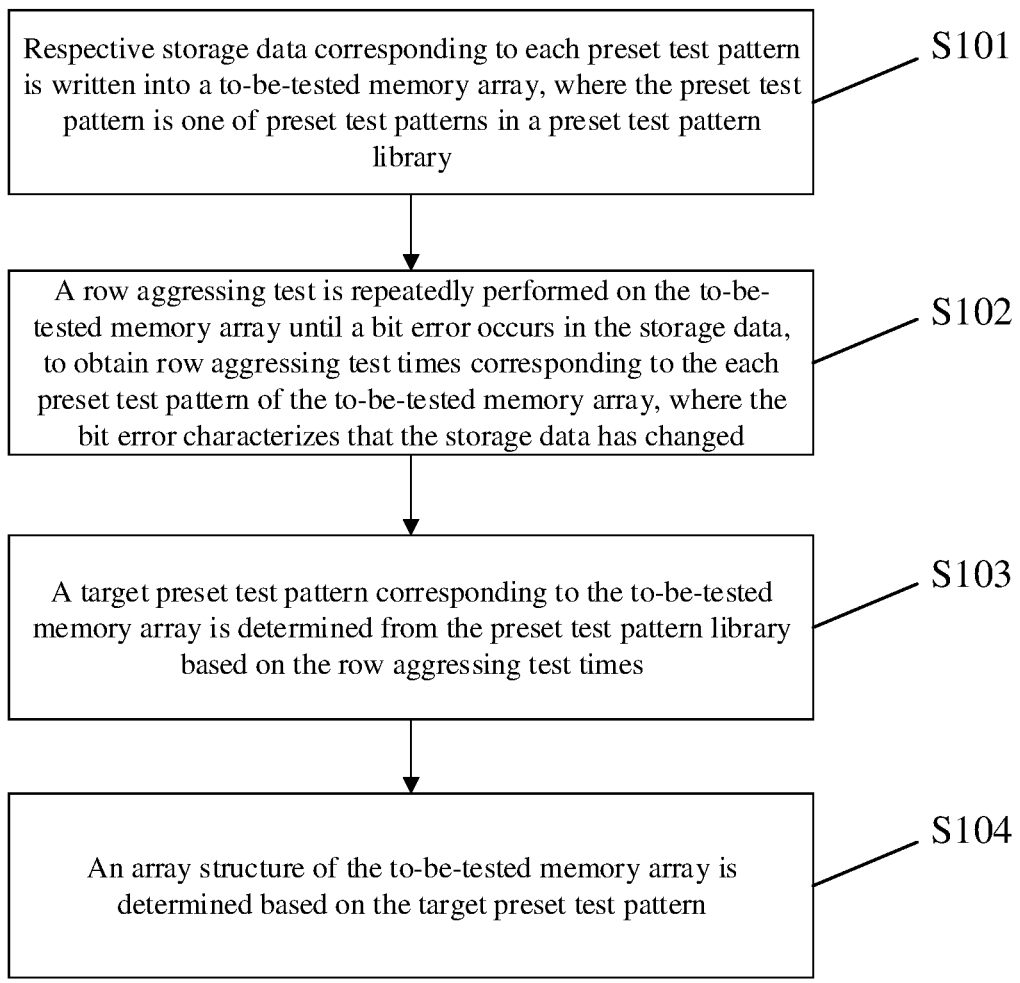
FIG. 2 is a first flowchart of a method for testing a memory array structure according to an embodiment of the disclosure.

FIG. 2 is an optional schematic flowchart of a method for testing a memory array structure according to an embodiment of the disclosure, which will be described with reference to operations shown in FIG. 2.

In S101, respective storage data corresponding to each preset test pattern is written into a to-be-tested memory array, where the preset test pattern is one of preset test patterns in a preset test pattern library.

In the embodiment of the disclosure, a test device may write respective storage data corresponding to each preset test pattern into the to-be-tested memory array.

It should be noted that the preset test pattern library is preset in the test device, and different preset test patterns correspond to different storage data; certain storage data is written into the memory array, so that memory cells in the memory array have corresponding charge storage conditions. A technician may prepare to-be-tested memory arrays belonging to the same batch, for analysis and testing, and the to-be-tested memory arrays have the same array structure. All of the to-be-tested memory arrays are analyzed and tested, the analysis results obtained are more reliable than results obtained by analyzing and testing a single to-be-tested memory array only.

Figure 3:
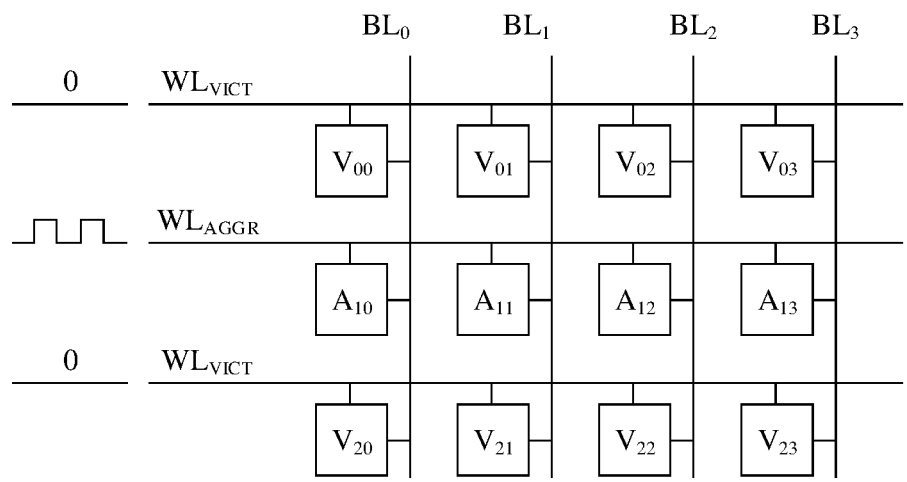
FIG. 3 is a first schematic diagram of effects of a method for testing a memory array structure according to an embodiment of the disclosure.

In the embodiment of the disclosure, firstly, the test device may partition memory cells of the to-be-tested memory array into Aggressor Row and Victim Row located adjacent to each other in the array structure. As shown in FIG. 3, $A_{10}$, $A_{11}$, $A_{12}$ and $A_{13}$ are partitioned as aggressor rows, and a word line (WL) where they are located is referred to as an aggressor row WL ($WL_{AGGR}$); $V_{00}$, $V_{01}$, $V_{02}$ and $V_{03}$ as well as $V_{20}$, $V_{21}$, $V_{22}$ and $V_{23}$ are partitioned as victim rows, and WLs where they are located are referred to as victim row WLs ($WL_{VICT}$).

Then, the test device may write aggressor row storage data into the aggressor row and write victim row storage data into the victim row. The aggressor row storage data is characterized as alternately changing binary codes, and the victim row storage data is characterized as continuously identical binary codes. For example, the test device may sequentially and alternately write, into the aggressor row, 01010101 and 10101010, i.e., 0x55 and 0xAA in hexadecimal, according to a first preset test pattern. That is, the test device may sequentially write 0x55, AA, 55, AA . . . or 0xAA, 55, AA, 55 . . . into the aggressor row; and continuously write, into the victim row, 00000000 or 11111111, i.e., 0x00 or 0xFF in hexadecimal, that is, sequentially write 0x00, 00, 00, 00 . . . or 0xFF, FF, FF, FF . . . into the victim row. For another example, the test device may continuously write 01010101 or 10101010 into the aggressor row according to a second preset test pattern, that is, continuously write 0x55, 55, 55, 55 . . . or 0xAA, AA, AA, AA . . . into the aggressor row; and continuously write 00000000 or 11111111 into the victim row, that is, sequentially write 0x00, 00, 00, 00 . . . or 0xFF, FF, FF, FF . . . into the victim row.

In S102, a row aggressing test is repeatedly performed on the to-be-tested memory array until a bit error occurs in the storage data, to obtain row aggressing test times corresponding to the each preset test pattern of the to-be-tested memory array, where the bit error characterizes that the storage data has changed.

In the embodiment of the disclosure, after writing the storage data, the test device may repeatedly perform the row aggressing test on the to-be-tested memory array; and stop the row aggressing test when occurrence of the bit error is detected in the storage data, and record corresponding row aggressing test times.

In the embodiment of the disclosure, the test device may perform the row aggressing test in a manner of Row Hammer. Referring to FIG. 3, the test device may perform ACT and PRE on the aggressor rows $A_{10}$, $A_{11}$, $A_{12}$ and $A_{13}$ quickly, repeatedly and alternately (that is, ACT→PRE→ACT→PRE . . . ). Performing ACT and PRE once is equivalent to performing quick access to the aggressor row once, which may generate interference to adjacent victim rows. The victim rows may discharge slowly due to frequent interference, and when the amount of charge stored in a victim memory cell is lower than a critical value as a result of the discharge, the bit error occurs, that is, the stored data changes, for example, from 1 to 0.

Furthermore, the test device may read existing storage data in the to-be-tested memory array at any time, and compare it with the written storage data; when the read storage data is different from the written storage data, that is, the bit error occurs, the row aggressing test is stopped and corresponding test times are recorded.

In S103, a target preset test pattern corresponding to the to-be-tested memory array is determined from the preset test pattern library based on the row aggressing test times.

In the embodiment of the disclosure, with respect to the to-be-tested memory array, the test device may determine the target preset test pattern corresponding to the to-be-tested memory array from the preset test pattern library based on the row aggressing test times.

In the embodiment of the disclosure, the test device may determine minimum row aggressing test times as target test times; and then determine the target preset test pattern corresponding to the target test times from the preset test pattern library. The target test times are the minimum row aggressing test times, and the target preset test pattern corresponding to the target test times is a test pattern in which bit error is easiest to occur.

For example, with respect to a preset test pattern, 10,000 ACT-PRE operations are performed on an aggressor row in the to-be-tested memory array, and then errors of data of adjacent victim rows are checked (i.e., checking whether a bit error occurs). When there is no error, 20,000 ACT-PRE operations are performed on the aggressor row, and then errors of data of the adjacent victim rows are checked. These processes are repeated until the bit error occurs in the adjacent victim rows, and the row aggressing test times corresponding to the preset test pattern are recorded, for example, occurrence of the bit error begins in the adjacent victim rows after 100,000 ACT-PRE operations. Then, with respect to another preset test pattern, the above processes are repeated for the same aggressor row in the to-be-tested memory array, until the bit error occurs in the adjacent victim rows, for example, occurrence of the bit error begins in the adjacent victim rows after 200,000 ACT-PRE operations. Then the preset test pattern corresponding to 100,000 times may be determined as the target preset test pattern.

In S104, an array structure of the to-be-tested memory array is determined based on the target preset test pattern.

In the embodiment of the disclosure, the test device may obtain the target preset test pattern of the to-be-tested memory array according to the above method. After all target preset test patterns corresponding to to-be-tested memory arrays having the same array structure are obtained, the array structures of the to-be-tested memory arrays may be determined based on the target preset test patterns.

Figure 4:
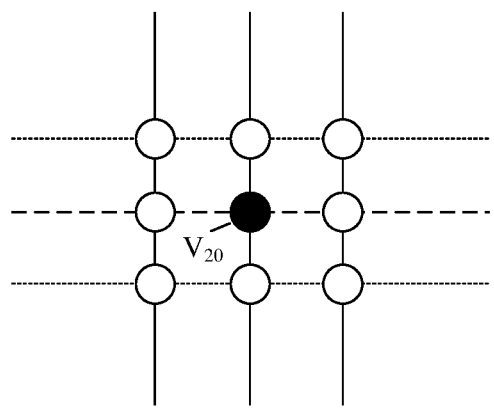
FIG. 4 is a second schematic diagram of effects of a method for testing a memory array structure according to an embodiment of the disclosure.

It should be noted that the degree of difficulty or ease of occurrence of the bit error in the victim row is related to charge storage conditions in memory cells around it. As shown in FIG. 4, when the victim row $V_{20}$ is in a fully charged state while each of the memory cells around it is in an uncharged state, the victim row $V_{20}$ is easiest to be affected by Row Hammer and thus subjected to the bit error, that is, occurrence of the bit error may be detected through minimum times of row aggressing tests. Therefore, charge states of the memory cells around the victim row may be reflected based on the row aggressing test times; and then the array structure of the to-be-tested memory array may be deduced by combining with contents of the written storage data.

Figure 5:
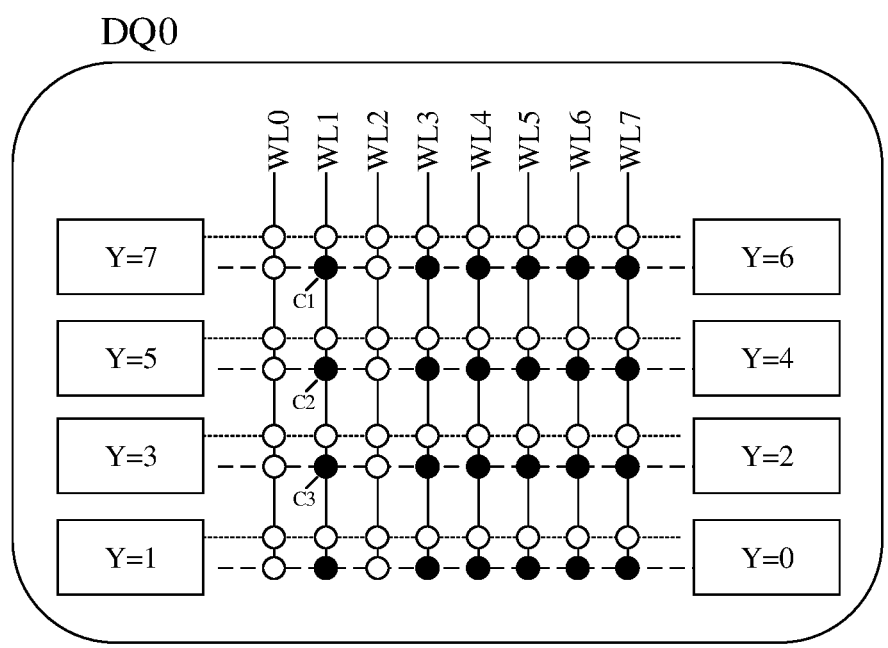
FIG. 5 is a third schematic diagram of effects of a method for testing a memory array structure according to an embodiment of the disclosure.

For example, when the target preset test pattern of the to-be-tested memory array is the first preset test pattern, the test device may determine that the array structure of the to-be-tested memory array is a first array structure. The first array structure is characterized by placing N continuous transmission bits of an m-th signal together, here m is greater than or equal to zero and less than or equal to M−1, and each of M and N is a multiple of 8. FIG. 5 shows characteristics of the first array structure. As shown in FIG. 5, eight continuous transmission bits (burst length) Y=0 to Y=7 of the 0-th signal DQ0 are placed together in a group, here the burst length characterizes the amount of data throughput of the memory array at a time.

Figure 6:
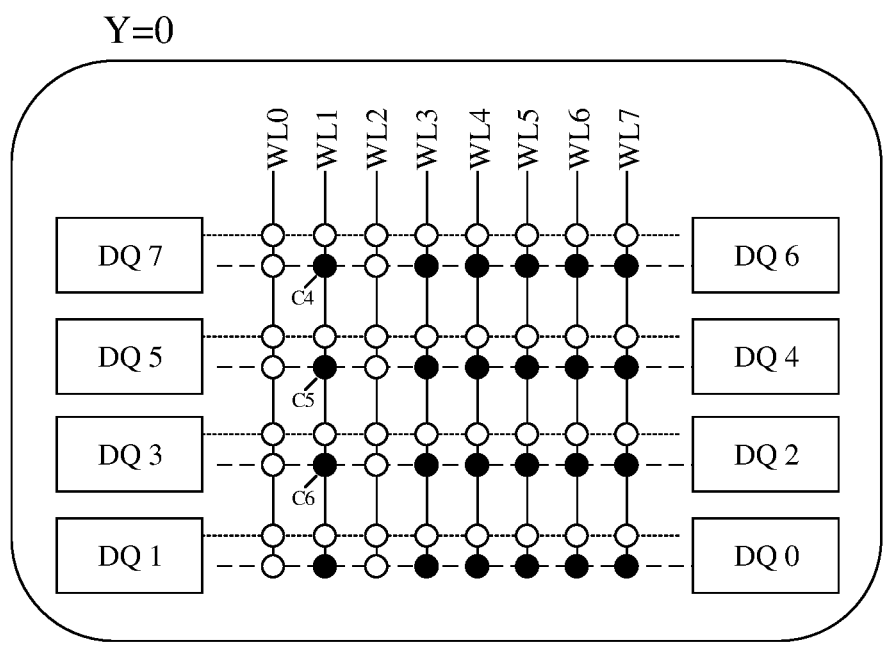
FIG. 6 is a fourth schematic diagram of effects of a method for testing a memory array structure according to an embodiment of the disclosure.

For another example, when the target preset test pattern of the to-be-tested memory array is the second preset test pattern, the test device may determine that the array structure of the to-be-tested memory array is a second array structure. The second array structure is characterized by placing the n-th continuous transmission bits of M signals together, here n is greater than or equal to zero and less than or equal to N−1, and each of M and N is a multiple of 8. FIG. 6 shows characteristics of the second array structure. As shown in FIG. 6, the 0-th continuous transmission bit Y=0 of eight signals DQ0 to DQ7 are placed together in a group.

It may be understood that according to the preset test pattern, the storage data is written into the to-be-tested memory array, then the row aggressing test is repeatedly performed on the to-be-tested memory array, and the row aggressing test times are recorded when the bit error occurs, to determine the target preset test pattern. Because the target preset test patterns, in which bit error is easiest to occur, corresponding to different array structures are different, the array structure of the to-be-tested memory array may be deduced by determining the target preset test pattern. Therefore, the array structure of the memory array may be determined based on the FPGA platform only without using an expensive and complicated testing machine, thereby reducing the cost of reverse design and simplifying the reverse design process.

In some embodiments of the disclosure, the to-be-tested memory array may include an aggressor row and a victim row located adjacent to each other in the array structure of the to-be-tested memory array.

The storage data may include aggressor row storage data and victim row storage data. The aggressor row storage data is characterized as alternately changing binary codes, such as 01010101 or 10101010, i.e., 0x55 or 0xAA in hexadecimal. The victim row storage data is characterized as continuously identical binary codes, such as 00000000 or 11111111, i.e., 0x00 or 0xFF in hexadecimal.

The preset test pattern library may include a first preset test pattern and a second preset test pattern, and the array structure may include a first array structure and a second array structure.

Figure 7:
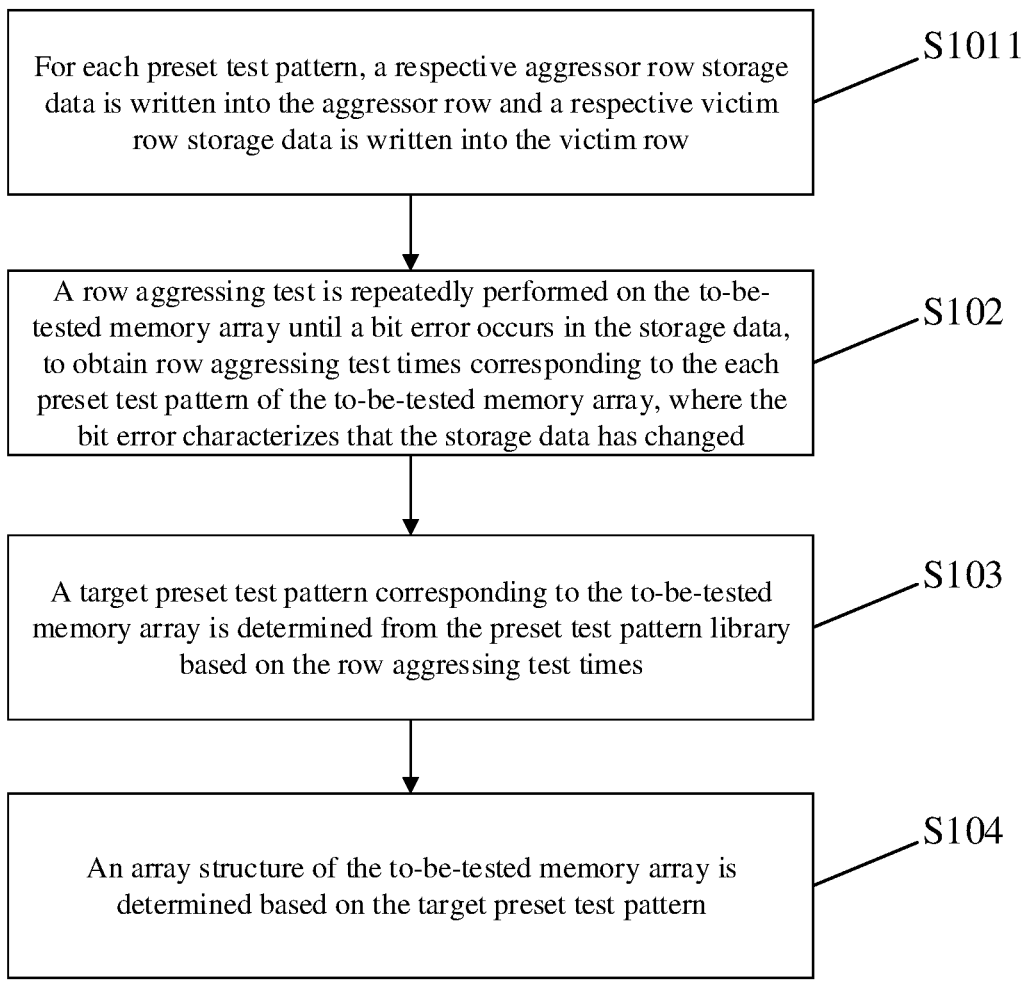
FIG. 7 is a second flowchart of a method for testing a memory array structure according to an embodiment of the disclosure.

In some embodiments of the disclosure, the operation S101 shown in FIG. 2 may be implemented by an operation S1011 shown in FIG. 7, which will be described with reference to respective operations.

In S1011, for each preset test pattern, a respective aggressor row storage data is written into the aggressor row and a respective victim row storage data is written into the victim row.

In the embodiment of the disclosure, for each preset test pattern, the test device may write the respective aggressor row storage data into the aggressor row of the to-be-tested memory array and write the respective victim row storage data into the victim row of the to-be-tested memory array.

It should be noted that when the victim row is in a fully charged state while each of the memory cells around it is in an uncharged state, the victim row is easiest to be affected by Row Hammer and thus subjected to the bit error. Therefore, the above situation may occur in the memory cell by writing alternately changing binary codes into the aggressor row and writing continuously identical binary codes into the victim row, for example, each of C1, C2 and C3 illustrated in FIG. 5 and C4, C5 and C6 illustrated in FIG. 6 is in the fully charged state, while each of the memory cells around them is in the uncharged state.

It may be understood that the aggressor row storage data is set to alternately changing binary codes, the victim row storage data is set to continuously identical binary codes, and the two types of codes are written into the to-be-tested memory array, respectively. Therefore, charge distribution situation prone to bit error may be generated in the memory array, so that the bit error may be induced by the row aggressing test to obtain row aggressing test times.

In some embodiments of the disclosure, the operation S104 shown in FIG. 2 may be implemented by an operation S1041, which will be described with reference to respective operations.

In S1041, when the target preset test pattern is the first preset test pattern, a first array structure of the to-be-tested memory array is determined based on the first preset test pattern.

In the embodiment of the disclosure, the test device may write the storage data into both the aggressor row and the victim row, according to the first preset test pattern. When the first preset test pattern is finally determined as the target preset test pattern, the test device may determine, based on the first preset test pattern, the array structure of the to-be-tested memory array as the first array structure.

For example, the first preset test pattern characterizes sequentially writing 0x55, AA, 55, AA . . . or 0xAA, 55, AA, 55 . . . into the aggressor row; and sequentially writing 0x00, 00, 00, 00 . . . or 0xFF, FF, FF, FF . . . into the victim row. The first array structure is characterized by placing N continuous transmission bits of an m-th signal together, here m is greater than or equal to zero and less than or equal to M−1, and each of M and N is a multiple of 8.

In some embodiments of the disclosure, the operation S104 shown in FIG. 2 may be implemented by an operation S1042, which will be described with reference to respective operations.

In S1042, when the target preset test pattern is the second preset test pattern, a second array structure of the to-be-tested memory array is determined based on the second preset test pattern.

In the embodiment of the disclosure, the test device may write the storage data into both the aggressor row and the victim row, according to the second preset test pattern. When the second preset test pattern is finally determined as the target preset test pattern, the test device may determine, based on the second preset test pattern, the array structures of at least two to-be-tested memory arrays as the second array structure.

For example, the second preset test pattern characterizes continuously writing 0x55, 55, 55, 55 . . . or 0xAA, AA, AA, AA . . . into the aggressor row; and sequentially writing 0x00, 00, 00, 00 . . . or 0xFF, FF, FF, FF . . . into the victim row. The second array structure is characterized by placing the n-th continuous transmission bits of M signals together, here n is greater than or equal to zero and less than or equal to N−1, and each of M and N is a multiple of 8.

In some embodiments of the disclosure, the aggressor row storage data may include first aggressor row sub-storage data and second aggressor row sub-storage data having opposite values, such as 0x55 and 0xAA, at each corresponding data bit thereof. The victim row storage data may include first victim row sub-storage data and second victim row sub-storage data having opposite values, such as 0x00 and 0xFF, at each corresponding data bit thereof.

In some embodiments of the disclosure, the operation S1011 shown in FIG. 7 may be implemented by operations S201~S204, which will be described with reference to respective operations.

In S201, according to the first preset test pattern, the first aggressor row sub-storage data and the second aggressor row sub-storage data are sequentially and alternately written into the aggressor row, and the first victim row sub-storage data is continuously written into the victim row.

In the embodiment of the disclosure, according to the first preset test pattern, the test device may sequentially and alternately write the first aggressor row sub-storage data and the second aggressor row sub-storage data into the aggressor row, and continuously write the first victim row sub-storage data into the victim row. For example, the test device may sequentially and alternately write 0x55, AA, 55, AA . . . into the aggressor row and continuously write 0x00, 00, 00, 00 . . . into the victim row.

In S202, according to the first preset test pattern, the first aggressor row sub-storage data and the second aggressor row sub-storage data are sequentially and alternately written into the aggressor row, and the second victim row sub-storage data is continuously written into the victim row.

In the embodiment of the disclosure, according to the first preset test pattern, the test device may also sequentially and alternately write the first aggressor row sub-storage data and the second aggressor row sub-storage data into the aggressor row, and continuously write the second victim row sub-storage data into the victim row. For example, the test device may sequentially and alternately write 0x55, AA, 55, AA . . . into the aggressor row and continuously write 0xFF, FF, FF, FF . . . into the victim row.

In S203, according to the first preset test pattern, the second aggressor row sub-storage data and the first aggressor row sub-storage data are sequentially and alternately written into the aggressor row, and the first victim row sub-storage data is continuously written into the victim row.

In the embodiment of the disclosure, according to the first preset test pattern, the test device may also sequentially and alternately write the second aggressor row sub-storage data and the first aggressor row sub-storage data into the aggressor row, and continuously write the first victim row sub-storage data into the victim row. For example, the test device may sequentially and alternately write 0xAA, 55, AA, 55 . . . into the aggressor row and continuously write 0x00, 00, 00, 00 . . . into the victim row.

In S204, according to the first preset test pattern, the second aggressor row sub-storage data and the first aggressor row sub-storage data are sequentially and alternately written into the aggressor row, and the second victim row sub-storage data is continuously written into the victim row.

In the embodiment of the disclosure, according to the first preset test pattern, the test device may also sequentially and alternately write the second aggressor row sub-storage data and the first aggressor row sub-storage data into the aggressor row, and continuously write the second victim row sub-storage data into the victim row. For example, the test device may sequentially and alternately write 0xAA, 55, AA, 55 . . . into the aggressor row and continuously write 0xFF, FF, FF, FF . . . into the victim row.

In some embodiments of the disclosure, the operation S1011 shown in FIG. 7 may be implemented by operations S301~S304, which will be described with reference to respective operations.

In S301, according to the second preset test pattern, the first aggressor row sub-storage data is continuously written into the aggressor row, and the first victim row sub-storage data is continuously written into the victim row.

In the embodiment of the disclosure, according to the second preset test pattern, the test device may continuously write the first aggressor row sub-storage data into the aggressor row, and continuously write the first victim row sub-storage data into the victim row. For example, the test device may continuously write 0x55, 55, 55, 55 . . . into the aggressor row and continuously write 0x00, 00, 00, 00 . . . into the victim row.

In S302, according to the second preset test pattern, the first aggressor row sub-storage data is continuously written into the aggressor row, and the second victim row sub-storage data is continuously written into the victim row.

In the embodiment of the disclosure, according to the second preset test pattern, the test device may also continuously write the first aggressor row sub-storage data into the aggressor row, and continuously write the second victim row sub-storage data into the victim row. For example, the test device may continuously write 0x55, 55, 55, 55 . . . into the aggressor row and continuously write 0xFF, FF, FF, FF . . . into the victim row.

In S303, according to the second preset test pattern, the second aggressor row sub-storage data is continuously written into the aggressor row, and the first victim row sub-storage data is continuously written into the victim row.

In the embodiment of the disclosure, according to the second preset test pattern, the test device may also continuously write the second aggressor row sub-storage data into the aggressor row, and continuously write the first victim row sub-storage data into the victim row. For example, the test device may continuously write 0xAA, AA, AA, AA . . . into the aggressor row and continuously write 0x00, 00, 00, 00 . . . into the victim row.

In S304, according to the second preset test pattern, the second aggressor row sub-storage data is continuously written into the aggressor row, and the second victim row sub-storage data is continuously written into the victim row.

In the embodiment of the disclosure, according to the second preset test pattern, the test device may also continuously write the second aggressor row sub-storage data into the aggressor row, and continuously write the second victim row sub-storage data into the victim row. For example, the test device may continuously write 0xAA, AA, AA, AA . . . into the aggressor row and continuously write 0xFF, FF, FF, FF . . . into the victim row.

In some embodiments of the disclosure, the row aggressing test may include quick access. The operation S102 shown in FIG. 2 may be implemented by an operation S1021, which will be described with reference to respective operations.

In S1021, quick access to the aggressor row is repeatedly performed.

In the embodiment of the disclosure, the test device may repeatedly perform the quick access to the aggressor row, which may generate interference to an adjacent victim row. The victim row may discharge slowly due to frequent interference, and when the amount of charge stored in a victim memory cell is lower than a critical value as a result of the discharge, the bit error occurs, that is, the stored data changes, for example, from 1 to 0.

Figure 8:
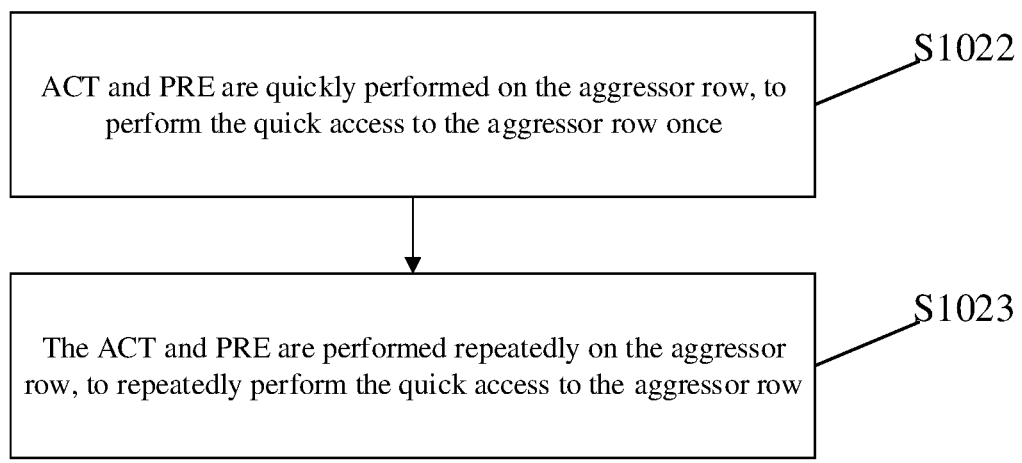
FIG. 8 is a third flowchart of a method for testing a memory array structure according to an embodiment of the disclosure.

In some embodiments of the disclosure, the operation S1021 may be implemented by operations S1022~S1023 shown in FIG. 8, which will be described with reference to respective operations.

In S1022, ACT and PRE are quickly performed on the aggressor row, to perform the quick access to the aggressor row once.

In the embodiment of the disclosure, the test device may quickly perform ACT and PRE on the aggressor row, to perform the quick access to the aggressor row once.

In S1023, the ACT and PRE are performed repeatedly on the aggressor row, to repeatedly perform the quick access to the aggressor row.

In the embodiment of the disclosure, the test device may repeatedly perform ACT-PRE-ACT-PRE . . . on the aggressor row, to achieve repeated quick access.

Figure 9:
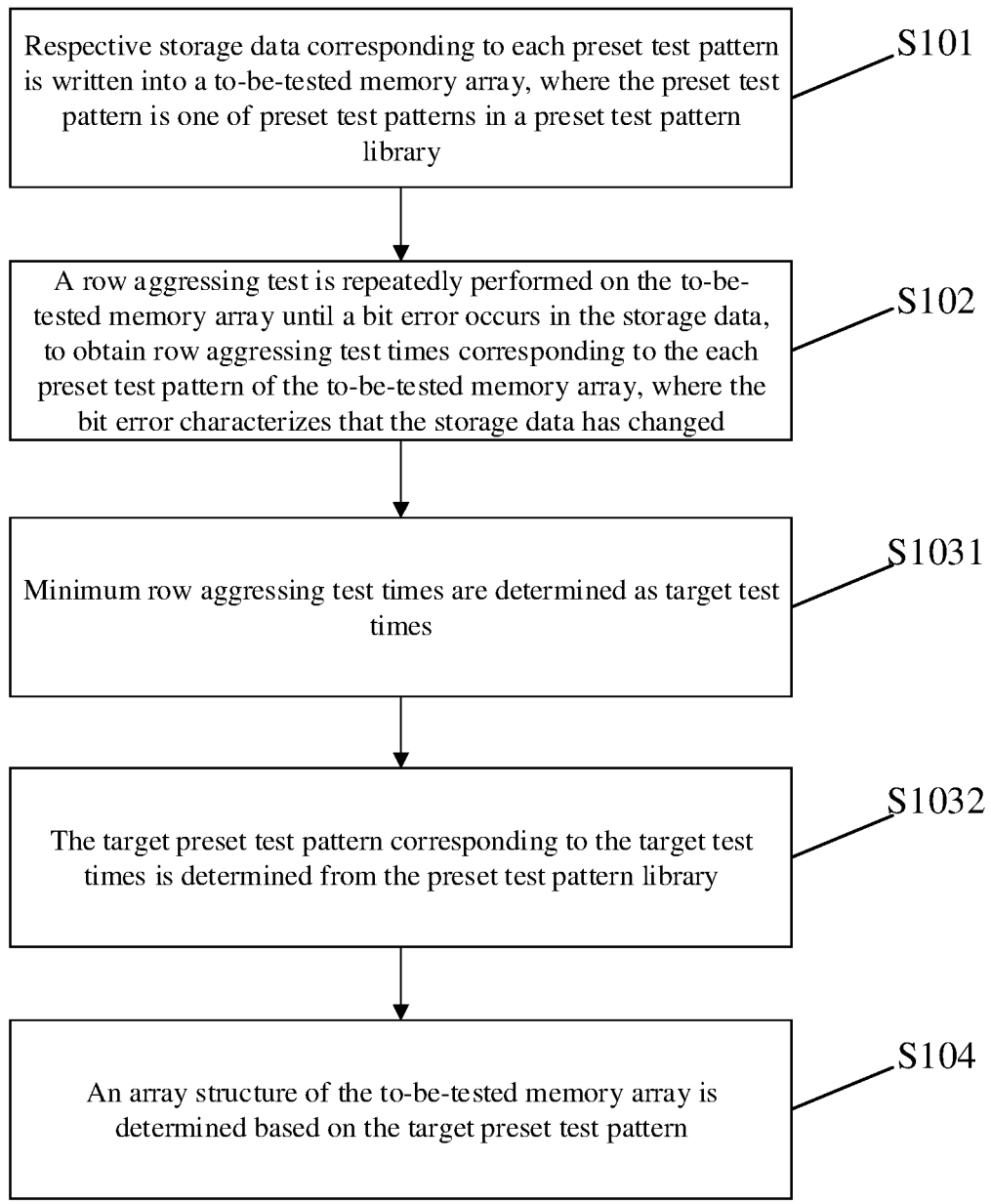
FIG. 9 is a fourth flowchart of a method for testing a memory array structure according to an embodiment of the disclosure.

In some embodiments of the disclosure, the operation S103 shown in FIG. 2 may be implemented by operations S1031~S1032 shown in FIG. 9, which will be described with reference to respective operations.

In S1031, minimum row aggressing test times are determined as target test times.

In the embodiment of the disclosure, for the to-be-tested memory array, the test device may determine the minimum row aggressing test times as target test times.

In S1032, the target preset test pattern corresponding to the target test times is determined from the preset test pattern library.

In the embodiment of the disclosure, the target test times are the minimum row aggressing test times, and the target preset test pattern corresponding to the target test times is a test pattern in which bit error is easiest to occur. The test device may determine the test pattern, in which bit error is easiest to occur (that is, the most bit error-prone test pattern), in the preset test pattern library as the target preset test pattern.

It may be understood that the test pattern in which bit error is easiest to occur is determined as the target preset test pattern, so that the array structure of the to-be-tested memory array may be deduced according to the target preset test pattern. Therefore, the array structure of the memory array may be determined based on the FPGA platform only without using an expensive and complicated testing machine, thereby reducing the cost of reverse design and simplifying the reverse design process.

In some embodiments of the disclosure, the to-be-tested memory array may be contained in SDRAM. The array structure of SDRAM may be determined by the above methods.

Figure 10:
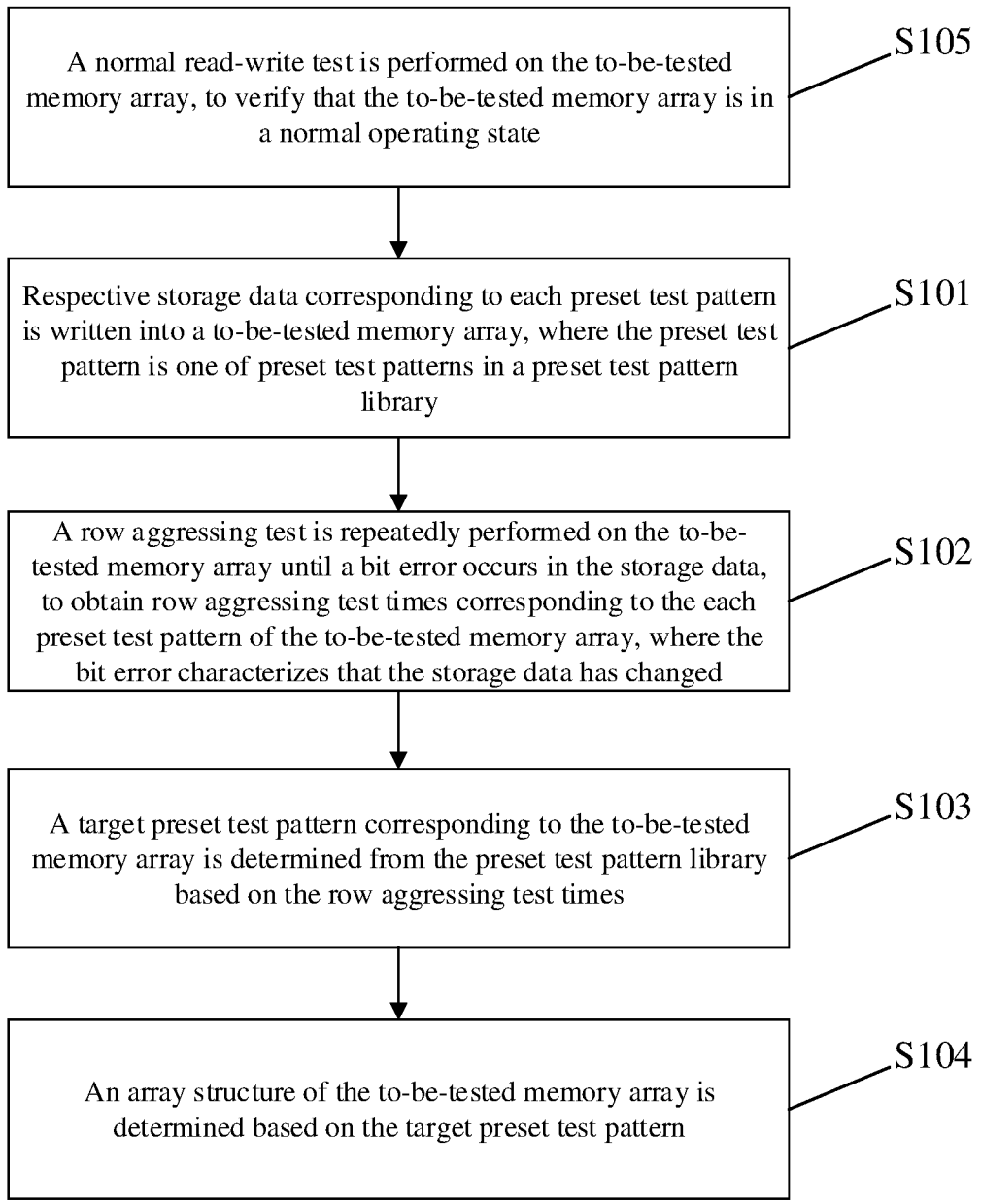
FIG. 10 is a fifth flowchart of a method for testing a memory array structure according to an embodiment of the disclosure.

In some embodiments of the disclosure, before the operation S101 shown in FIG. 2, the method may further include an operation S105 shown in FIG. 10, which will be described with reference to respective operations.

In S105, a normal read-write test is performed on the to-be-tested memory array, to verify that the to-be-tested memory array is in a normal operating state.

In the embodiment of the disclosure, before a structure test is performed on the to-be-tested memory array, normal read-write tests such as write, read back, check, and the like, may be performed on the to-be-tested memory array, to verify that the to-be-tested memory array is in a normal operating state.

It may be understood that before the test is performed, the normal read-write test is performed on the to-be-tested memory array, to verify that the operation state of the to-be-tested memory array is normal, thereby avoiding an impact on accuracy of the structure test result due to an abnormal state of the to-be-tested memory array.

Figure 11:
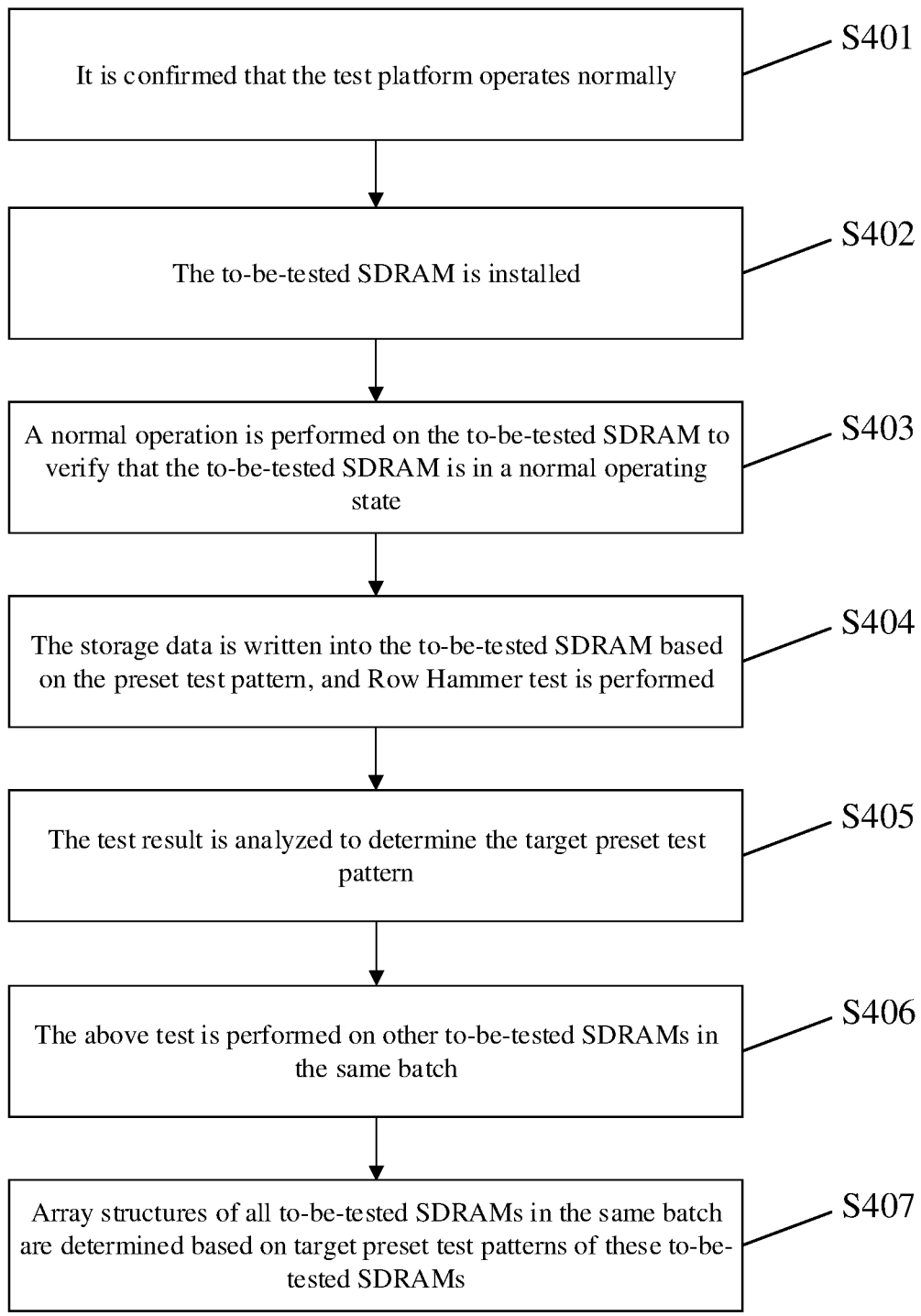
FIG. 11 is a sixth flowchart of a method for testing a memory array structure according to an embodiment of the disclosure.

FIG. 11 is an optional schematic flowchart of a method for testing a memory array structure according to an embodiment of the disclosure, which will be described with reference to operations shown in FIG. 11.

In S401, it is confirmed that the test platform operates normally.

In the embodiment of the disclosure, before performing a chip structure test, a designer may first confirm whether the FPGA test platform operates normally. For example, a Row Hammer test is performed with an SDRAM with a known array structure to verify whether the test result is consistent with that under the known array structure.

In S402, the to-be-tested SDRAM is installed.

In the embodiment of the disclosure, after confirming that the test platform operates normally, the designer may install the to-be-tested SDRAM t into the test device.

In S403, a normal operation is performed on the to-be-tested SDRAM to verify that the to-be-tested SDRAM is in a normal operating state.

In the embodiment of the disclosure, the designer may first perform the normal operation such as write, read back, check, and the like on the to-be-tested SDRAM, to verify whether the operation state of the to-be-tested SDRAM is normal.

In S404, the storage data is written into the to-be-tested SDRAM based on the preset test pattern, and Row Hammer test is performed.

In the embodiment of the disclosure, after verifying that the operation state of the to-be-tested SDRAM is normal, the designer may write the storage data into the to-be-tested SDRAM through the test device and perform Row Hammer test; that is, the aggressor row storage data and the victim row storage data are written into the aggressor row and the victim row, respectively, according to the preset test pattern, and Row Hammer test is performed to perform ACT and PRE on the aggressor row quickly, repeatedly and alternately.

In S405, the test result is analyzed to determine the target preset test pattern.

In the embodiment of the disclosure, after completing the Row Hammer test, the designer may analyze Row Hammer test result through the test device, and find out a preset test pattern corresponding to the worst case with the smallest times according to Row Hammer aggressing times that have been carried out when bit error occurs for the first time, and determine the preset test pattern as the target preset test pattern.

In S406, the above test is performed on other to-be-tested SDRAMs in the same batch.

In the embodiment of the disclosure, after the structure test on a certain to-be-tested SDRAM ends, the designer may perform the above structure test on all other to-be-tested SDRAMs of the same batch through the test device, and these to-be-tested SDRAMs have the same array structure.

In S407, array structures of all to-be-tested SDRAMs in the same batch are determined based on target preset test patterns of these to-be-tested SDRAMs.

In the embodiment of the disclosure, the designer may determine target preset test patterns of all to-be-tested SDRAMs in the same batch through the test device, and determine an array structure of these to-be-tested SDRAMs. Analysis test is performed on all the to-be-tested memory arrays in the same batch, the analysis result obtained is more reliable than that obtained under analysis test performed on single to-be-tested memory array only.

It may be understood that FPGA-based SDRAM test platform does not need to occupy a fixed space of the to-be-tested SDRAM, and may test across the entire internal space of the SDRAM. It has the advantages of low price and high popularity compared with ATE testing machine; and it has the advantages of quick operation and easy mastery compared with conventional reverse engineering.

Figure 12:
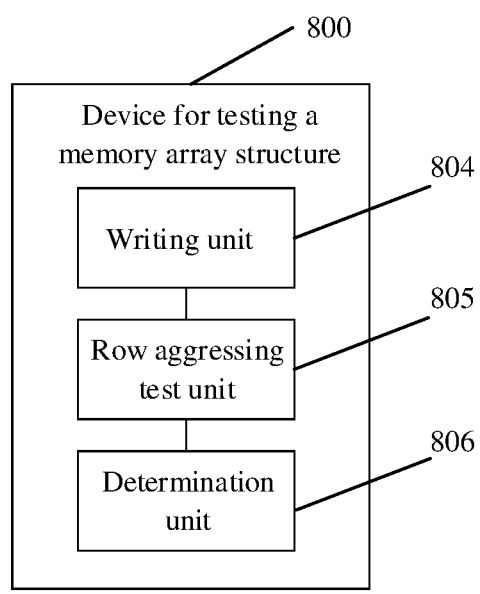
FIG. 12 is a first schematic structural diagram of a device for testing a memory array structure according to an embodiment of the disclosure.

FIG. 12 is an optional schematic structural diagram of a device for testing a memory array structure according to an embodiment of the disclosure. As shown in FIG. 12, an embodiment of the disclosure further provides a device 800 for testing a memory array structure, including a writing unit 804, a row aggressing test unit 805 and a determination unit 806.

The writing unit 804 is configured to write respective storage data corresponding to each preset test pattern into a to-be-tested memory array, where the each preset test pattern is one of preset test patterns in a preset test pattern library.

The row aggressing test unit 805 is configured to repeatedly perform a row aggressing test on the to-be-tested memory array until a bit error occurs in the storage data, to obtain row aggressing test times corresponding to the each preset test pattern of the to-be-tested memory array. The bit error characterizes that the storage data has changed.

The determination unit 806 is configured to determine, based on the row aggressing test times, a target preset test pattern corresponding to the to-be-tested memory array from the preset test pattern library, and determine an array structure of the to-be-tested memory array based on the target preset test pattern.

In some embodiments of the disclosure, the to-be-tested memory array may include an aggressor row and a victim row located adjacent to each other in the array structure of the to-be-tested memory array. The storage data may include aggressor row storage data characterized as alternately changing binary codes and victim row storage data characterized as continuously identical binary codes. The preset test pattern library may include a first preset test pattern and a second preset test pattern, and the array structure may include a first array structure and a second array structure.

In some embodiments of the disclosure, the writing unit 804 may further be configured to write the aggressor row storage data into the aggressor row and write the victim row storage data into the victim row, according to the each preset test pattern.

In some embodiments of the disclosure, the determination unit 806 may further be configured to determine a first array structure of the to-be-tested memory array based on the first preset test pattern when the target preset test pattern is the first preset test pattern.

In some embodiments of the disclosure, the first array structure may be characterized by placing N continuous transmission bits of an m-th signal together, here m is greater than or equal to zero and less than or equal to M−1, and each of M and N is a multiple of 8.

In some embodiments of the disclosure, the determination unit 806 may further be configured to determine a second array structure of the to-be-tested memory array based on the second preset test pattern when the target preset test pattern is the second preset test pattern.

In some embodiments of the disclosure, the second array structure may be characterized by placing n-th continuous transmission bits of M signals together, here n is greater than or equal to zero and less than or equal to N−1, and each of M and N is a multiple of 8.

In some embodiments of the disclosure, the aggressor row storage data may include first aggressor row sub-storage data and second aggressor row sub-storage data having opposite values at each corresponding data bit thereof. The victim row storage data may include first victim row sub-storage data and second victim row sub-storage data having opposite values at each corresponding data bit thereof.

In some embodiments of the disclosure, the writing unit 804 may further be configured to: sequentially and alternately write the first aggressor row sub-storage data and the second aggressor row sub-storage data into the aggressor row, and continuously write the first victim row sub-storage data into the victim row, according to the first preset test pattern; or, sequentially and alternately write the first aggressor row sub-storage data and the second aggressor row sub-storage data into the aggressor row, and continuously write the second victim row sub-storage data into the victim row, according to the first preset test pattern; or, sequentially and alternately write the second aggressor row sub-storage data and the first aggressor row sub-storage data into the aggressor row, and continuously write the first victim row sub-storage data into the victim row, according to the first preset test pattern; or, sequentially and alternately write the second aggressor row sub-storage data and the first aggressor row sub-storage data into the aggressor row, and continuously write the second victim row sub-storage data into the victim row, according to the first preset test pattern.

In some embodiments of the disclosure, the writing unit 804 may further be configured to: continuously write the first aggressor row sub-storage data into the aggressor row, and continuously write the first victim row sub-storage data into the victim row, according to the second preset test pattern; or, continuously write the first aggressor row sub-storage data into the aggressor row, and continuously write the second victim row sub-storage data into the victim row, according to the second preset test pattern; or, continuously write the second aggressor row sub-storage data into the aggressor row, and continuously write the first victim row sub-storage data into the victim row, according to the second preset test pattern; or, continuously write the second aggressor row sub-storage data into the aggressor row, and continuously write the second victim row sub-storage data into the victim row, according to the second preset test pattern.

In some embodiments of the disclosure, the row aggressing test unit 805 may further be configured to repeatedly perform quick access to the aggressor row.

In some embodiments of the disclosure, the row aggressing test unit 805 may further be configured to quickly perform ACT and PRE on the aggressor row, to perform the quick access to the aggressor row once; and repeat the process, to repeatedly perform the quick access to the aggressor row.

In some embodiments of the disclosure, the determination unit 806 may further be configured to determine minimum row aggressing test times as target test times, and determine the target preset test pattern corresponding to the target test times from the preset test pattern library.

In some embodiments of the disclosure, the to-be-tested memory array may be contained in SDRAM.

In some embodiments of the disclosure, the device for testing a memory array structure 800 may further include a normal test unit 807.

The normal test unit 807 is configured to perform a normal read-write test on the to-be-tested memory array, to verify that operation state of the to-be-tested memory array is normal.

Figure 13:
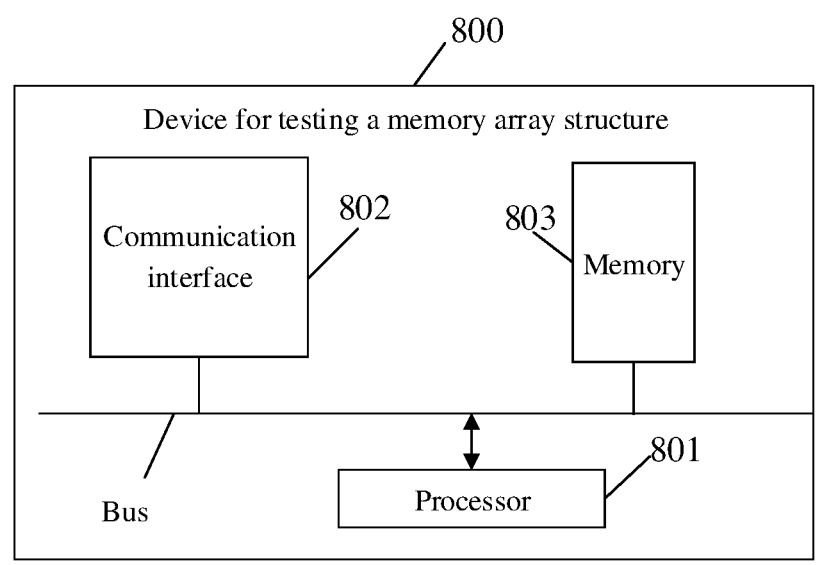
FIG. 13 is a second schematic structural diagram of a device for testing a memory array structure according to an embodiment of the disclosure.

FIG. 13 is an optional schematic structural diagram of a device for testing a memory array structure according to an embodiment of the disclosure. As shown in FIG. 13, hardware entities of the device 800 for testing a memory array structure include a processor 801, a communication interface 802 and a memory 803.

The processor 801 usually controls overall operation of the device for testing a memory array structure 800.

The communication interface 802 may enable the device for testing a memory array structure 800 to communicate with other devices or apparatuses over a network.

The memory 803 is configured to store instructions and applications executable by the processor 801, and may also cache data (e.g., image data, audio data, voice communication data, and video communication data) to be processed or already processed by the processor 801 and modules in the device for testing a memory array structure 800, and may be implemented by a flash memory (FLASH) or Random Access Memory (RAM).

It should be noted that in the embodiments of the disclosure, when the above method for testing a memory array structure is implemented in form of a software function module and sold or used as an independent product, it may also be stored in a computer-readable storage medium. Based on such an understanding, the technical solutions of the embodiments of the disclosure substantially or parts making contributions to the related art may be embodied in form of a software product, and the computer software product is stored in a storage medium, including several instructions configured to enable the device for testing a memory array structure 800 (which may be a personal computer, a server, a network device, or the like) to execute all or part of the method in each embodiment of the disclosure. The abovementioned storage medium includes various media capable of storing program codes such as a U disk, a mobile hard disk, a Read Only Memory (ROM), a magnetic disk, an optical disk, or the like. Therefore, the embodiments of the disclosure are not limited to any particular combination of hardware and software.

Accordingly, an embodiment of the disclosure provide a computer-readable storage medium having stored therein a computer program that, when executed by a processor, causes the processor to perform operations of the method corresponding to the above device for testing a memory array structure.

It should be noted here that the above descriptions of the storage medium and device embodiments are similar to the above descriptions of the method embodiments and have advantageous effects similar to those of the method embodiments. Technical details not disclosed in the storage medium and device embodiments of the disclosure may be understood with reference to the descriptions of the method embodiments of the disclosure.

It should be noted that in the disclosure, the terms "include", "including" or any other variation thereof are intended to cover non-exclusive inclusion, such that a process, method, article, or device including a series of elements includes not only those elements but also other elements that are not listed explicitly, or elements inherent to such process, method, article, or device. Without any more limitation, an element defined by a sentence "include a . . . " does not exclude other identical elements also existing in a process, method, article, or device including the element.

In some embodiments provided by the disclosure, it should be understood that the disclosed device and method may be implemented in another manner. The above device embodiments are only schematic, for example, division of the units is only logical function division, and other division manners may be adopted during practical implementation. For example, multiple units or components may be combined or integrated into another system, or some characteristics may be ignored or not executed. Furthermore, coupling or direct coupling or communication connection between each shown or discussed component may be indirect coupling or communication connection, implemented through some interfaces, of the device or the units, and may be electrical, mechanical or adopt other forms.

The units described as separate parts may be or may not be physically separated, and parts shown as units may be or may not be physical units, and namely may be located in the same place, or may also be distributed to multiple network units. Part or all of the units may be selected to achieve the purpose of the solutions of the embodiments according to a practical requirement.

Furthermore, each functional unit in each embodiment of the disclosure may be integrated into a processing unit, each unit may also physically exist independently, and two or more than two units may also be integrated into a unit; the integrated unit may be implemented in form of hardware or in form of hardware plus software functional units.

The above descriptions are merely specific embodiments of the disclosure, however, the scope of protection of the disclosure is not limited thereto, and variation or replacement readily conceivable by any person skilled in the art within the technical scope of the disclosure shall fall within the scope of protection of the disclosure. Therefore, the scope of protection of the disclosure is subjected to the scope of protection of the claims.

INDUSTRIAL PRACTICABILITY

The embodiments of the disclosure provide a method and device for testing a memory array structure, and a storage medium, in which respective storage data corresponding to each preset test pattern is written into a to-be-tested memory array; then a row aggressing test is repeatedly performed on the to-be-tested memory array until a bit error occurs in the storage data, to obtain row aggressing test times, corresponding to the each preset test pattern, of the to-be-tested memory array, here the bit error characterizes that the storage data has changed; then a target preset test pattern corresponding to the to-be-tested memory array is determined from the preset test pattern library based on the row aggressing test times; finally, an array structure of the to-be-tested memory array is determined based on the target preset test pattern. Therefore, the memory array structure is determined without using conventional reverse test devices, which avoids the problem of high cost and complicated process caused by using conventional reverse design methods, thereby reducing the cost of reverse design and simplifying the reverse design process.

The invention claimed is:

1. A method for testing a memory array structure, comprising:
   writing respective storage data corresponding to each preset test pattern into a to-be-tested memory array, wherein the each preset test pattern is one of preset test patterns in a preset test pattern library;
   repeatedly performing a row aggressing test on the to-be-tested memory array until a bit error occurs in the storage data, to obtain row aggressing test times corresponding to the each preset test pattern of the to-be-tested memory array, wherein the bit error characterizes that the storage data has changed;
   determining, based on the row aggressing test times, a target preset test pattern corresponding to the to-be-tested memory array from the preset test pattern library; and
   determining an array structure of the to-be-tested memory array based on the target preset test pattern.

2. The method of claim 1, wherein the to-be-tested memory array comprises an aggressor row and a victim row located adjacent to each other in the array structure of the to-be-tested memory array;
   the storage data comprises aggressor row storage data characterized as alternately changing binary codes and victim row storage data characterized as continuously identical binary codes;
   the preset test pattern library comprises a first preset test pattern and a second preset test pattern, and the array structure comprises a first array structure and a second array structure.

3. The method of claim 2, wherein the row aggressing test comprises quick access, and
   wherein repeatedly performing the row aggressing test on the to-be-tested memory array comprises:
   repeatedly performing quick access to the aggressor row.

4. The method of claim 3, wherein repeatedly performing the quick access to the aggressor row comprises: quickly performing activation (ACT) and precharge (PRE) on the aggressor row, to perform the quick access to the aggressor row once; and repeatedly performing the ACT and PRE on the aggressor row, to repeatedly perform the quick access to the aggressor row.

5. The method of claim 2, wherein writing the respective storage data corresponding to each preset test pattern into the to-be-tested memory array comprises:
for the each preset test pattern, writing the aggressor row storage data into the aggressor row and writing the victim row storage data into the victim row.

6. The method of claim 5, wherein determining the array structure of the to-be-tested memory array based on the target preset test pattern comprises:
when the target preset test pattern is the first preset test pattern, determining the first array structure of the to-be-tested memory array based on the first preset test pattern.

7. The method of claim 6, wherein the first array structure is characterized by placing N continuous transmission bits of an m-th signal together, wherein m is greater than or equal to zero and less than or equal to M−1, and each of M and N is a multiple of 8.

8. The method of claim 6, wherein the aggressor row storage data comprises first aggressor row sub-storage data and second aggressor row sub-storage data having opposite values at each corresponding data bit;
the victim row storage data comprises first victim row sub-storage data and second victim row sub-storage data having opposite values at each corresponding data bit.

9. The method of claim 8, wherein for the each preset test pattern, writing the aggressor row storage data into the aggressor row and writing the victim row storage data into the victim row comprises one of the following:
according to the first preset test pattern, sequentially and alternately writing the first aggressor row sub-storage data and the second aggressor row sub-storage data into the aggressor row, and continuously writing the first victim row sub-storage data into the victim row;
according to the first preset test pattern, sequentially and alternately writing the first aggressor row sub-storage data and the second aggressor row sub-storage data into the aggressor row, and continuously writing the second victim row sub-storage data into the victim row;
according to the first preset test pattern, sequentially and alternately writing the second aggressor row sub-storage data and the first aggressor row sub-storage data into the aggressor row, and continuously writing the first victim row sub-storage data into the victim row; or
according to the first preset test pattern, sequentially and alternately writing the second aggressor row sub-storage data and the first aggressor row sub-storage data into the aggressor row, and continuously writing the second victim row sub-storage data into the victim row.

10. The method of claim 8, wherein for each preset test pattern, writing the aggressor row storage data into the aggressor row and writing the victim row storage data into the victim row comprises one of the following:
according to the second preset test pattern, continuously writing the first aggressor row sub-storage data into the aggressor row, and continuously writing the first victim row sub-storage data into the victim row;
according to the second preset test pattern, continuously writing the first aggressor row sub-storage data into the aggressor row, and continuously writing the second victim row sub-storage data into the victim row;
according to the second preset test pattern, continuously writing the second aggressor row sub-storage data into the aggressor row, and continuously writing the first victim row sub-storage data into the victim row; or
according to the second preset test pattern, continuously writing the second aggressor row sub-storage data into the aggressor row, and continuously writing the second victim row sub-storage data into the victim row.

11. The method of claim 5, wherein determining the array structure of the to-be-tested memory array based on the target preset test pattern comprises:
when the target preset test pattern is the second preset test pattern, determining the second array structure of the to-be-tested memory array based on the second preset test pattern.

12. The method of claim 11, wherein the second array structure is characterized by placing n-th continuous transmission bits of M signals together, wherein n is greater than or equal to zero and less than or equal to N−1, and each of M and N is a multiple of 8.

13. The method of claim 1, wherein determining the target preset test pattern corresponding to the to-be-tested memory array from the preset test pattern library based on the row aggressing test times comprises:
determining minimum row aggressing test times as target test times; and
determining the target preset test pattern corresponding to the target test times from the preset test pattern library.

14. The method of claim 1, wherein the to-be-tested memory array is contained in a synchronous dynamic random access memory (SDRAM).

15. The method of claim 1, further comprising: before writing the respective storage data corresponding to each preset test pattern into the to-be-tested memory array,
performing a normal read-write test on the to-be-tested memory array to verify that the to-be-tested memory array is in a normal operating state.

16. A device for testing a memory array structure, comprising:
a processor; and
a memory configured to store instructions executable by the processor,
wherein the processor is configured to perform, when executing the instructions stored in the memory, operations comprising:
writing respective storage data corresponding to each preset test pattern into a to-be-tested memory array, wherein the each preset test pattern is one of preset test patterns in a preset test pattern library;
repeatedly performing a row aggressing test on the to-be-tested memory array until a bit error occurs in the storage data, to obtain row aggressing test times corresponding to the each preset test pattern of the to-be-tested memory array, wherein the bit error characterizes that the storage data has changed;
determining, based on the row aggressing test times, a target preset test pattern corresponding to the to-be-tested memory array from the preset test pattern library; and
determining an array structure of the to-be-tested memory array based on the target preset test pattern.

17. The device of claim 16, wherein the to-be-tested memory array comprises an aggressor row and a victim row located adjacent to each other in the array structure of the to-be-tested memory array;

the storage data comprises aggressor row storage data characterized as alternately changing binary codes and victim row storage data characterized as continuously identical binary codes;

the preset test pattern library comprises a first preset test pattern and a second preset test pattern, and the array structure comprises a first array structure and a second array structure.

18. The device of claim 16, wherein determining the target preset test pattern corresponding to the to-be-tested memory array from the preset test pattern library based on the row aggressing test times comprises:

determining minimum row aggressing test times as target test times; and determining the target preset test pattern corresponding to the target test times from the preset test pattern library.

19. The device of claim 16, wherein the processor is further configured to execute the instructions stored in the memory to perform operations comprising: before writing the respective storage data corresponding to each preset test pattern into the to-be-tested memory array, performing a normal read-write test on the to-be-tested memory array to verify that the to-be-tested memory array is in a normal operating state.

20. A non-transitory storage medium having stored therein executable instructions that, when executed by a processor, cause the processor to perform operations comprising:

writing respective storage data corresponding to each preset test pattern into a to-be-tested memory array, wherein the each preset test pattern is one of preset test patterns in a preset test pattern library;

repeatedly performing a row aggressing test on the to-be-tested memory array until a bit error occurs in the storage data, to obtain row aggressing test times corresponding to the each preset test pattern of the to-be-tested memory array, wherein the bit error characterizes that the storage data has changed;

determining, based on the row aggressing test times, a target preset test pattern corresponding to the to-be-tested memory array from the preset test pattern library; and determining an array structure of the to-be-tested memory array based on the target preset test pattern.

* * * * *